United States Patent
Pushp

(10) Patent No.: US 11,688,601 B2
(45) Date of Patent: Jun. 27, 2023

(54) OBTAINING A CLEAN NITRIDE SURFACE BY ANNEALING

(71) Applicant: International Business Machines Corporation, Armonk, NY (US)

(72) Inventor: Aakash Pushp, Santa Clara, CA (US)

(73) Assignee: International Business Machines Corporation, Armonk, NY (US)

(*) Notice: Subject to any disclaimer, the term of this patent is extended or adjusted under 35 U.S.C. 154(b) by 55 days.

(21) Appl. No.: 17/106,287

(22) Filed: Nov. 30, 2020

(65) Prior Publication Data

US 2022/0172946 A1    Jun. 2, 2022

(51) Int. Cl.
*H01L 21/02* (2006.01)
*H01L 21/324* (2006.01)

(52) U.S. Cl.
CPC .. *H01L 21/02172* (2013.01); *H01L 21/02271* (2013.01); *H01L 21/324* (2013.01)

(58) Field of Classification Search
CPC ......... H01L 21/02172; H01L 21/02271; H01L 21/324
See application file for complete search history.

(56) References Cited

U.S. PATENT DOCUMENTS

| 5,654,235 | A | * | 8/1997 | Matsumoto | ....... H01L 23/53223 438/658 |
| 5,866,947 | A | | 2/1999 | Wang et al. | |
| 8,795,440 | B2 | | 8/2014 | Imer et al. | |
| 2003/0168750 | A1 | | 9/2003 | Basceri | |
| 2005/0164466 | A1 | * | 7/2005 | Zheng | ..................... H01L 28/60 438/398 |
| 2006/0128108 | A1 | | 6/2006 | Kim et al. | |
| 2010/0227532 | A1 | | 9/2010 | Ishibashi et al. | |
| 2013/0200491 | A1 | * | 8/2013 | Wamura | .................. H01L 28/92 257/532 |
| 2018/0240865 | A1 | | 8/2018 | Ando | |

(Continued)

FOREIGN PATENT DOCUMENTS

FR       2988219 B1     3/2015

OTHER PUBLICATIONS

Kavitha et al, "The effect of annealing on the structural, optical and electrical properties of Titanium Nitride (TiN) thin films prepared by DC magnetron sputtering with supported discharge," J Mater Sci: Mater Electron (2016) 27, pp. 10427-10434 (Year: 2016).*

(Continued)

*Primary Examiner* — Julia Slutsker
(74) *Attorney, Agent, or Firm* — Jeffrey M. Ingalls

(57) ABSTRACT

A method of forming a composite crystalline nitride structure is provided. The method includes depositing a first crystalline nitride layer on a substrate, patterning the first crystalline nitride layer to form a patterned crystalline nitride layer having a top surface and that includes undulations, annealing the patterned crystalline nitride layer at a temperature between 300° C. to 850° C. to form an annealed patterned crystalline nitride layer, and depositing a second crystalline nitride layer on the annealed patterned crystalline nitride layer. The second crystalline nitride layer is lattice-matched to the underlying annealed patterned crystalline nitride layer to within 2%, thereby forming the composite crystalline nitride structure.

20 Claims, 5 Drawing Sheets

(56) References Cited

U.S. PATENT DOCUMENTS

2018/0247974 A1    8/2018  Oliver
2019/0057860 A1*   2/2019  Yoon .................. H01L 21/0234

OTHER PUBLICATIONS

Greczynski et al., "In-situ observation of self-cleansing phenomena during ultra-high vacuum anneal of transition metal nitride thin films . . . ", Article in Applied Physics Letters, Nov. 2016, Research Gate, 6 pages.

International Search Report and Written Opinion for Application PCT/EP2021/079391, dated Jan. 31, 2022, 11 pages.

Seung, et al., "A Study of Sputtered TiN Gate Electrode Etching with Various Wet Chemicals and Post Etch Annealing for Complementary Metal-Oxide-Semiconductor Device Integration Applications," Japanese Journal of Applied Physics, Japan Society of Applied Physics, Oct. 1, 2012, pp. 101203-1-101203-4, vol. 51, No. 10R.

* cited by examiner

DIRTY INTERFACE

DIRTY INTERFACE

CLEAN INTERFACE          CLEAN INTERFACE

OBTAINING A CLEAN NITRIDE SURFACE BY ANNEALING

BACKGROUND

The present disclosure relates to the electrical, electronic and semiconductor fields. In particular, the present disclosure relates to a method to obtain a clean nitride surface of a crystalline nitride layer.

Certain transition metal nitride materials are used to form layers in semiconductor devices. In some examples, a plurality of different nitride layers are formed on top of each other in different processing steps. In some cases, the nitride materials are the same for each of the plurality of nitride layers, and in other cases the nitride materials are different. In certain examples, a vacuum break may occur between the formation of different nitride layers. There may be an inherent lattice mismatch between the crystal structures of the different layers, which can cause the interface between the layers to have imperfections. In certain examples, a first nitride layer (e.g., TiN) may be encapsulated with amorphous Si/SiN to prevent TiN oxidation of the first nitride layer after a vacuum break.

SUMMARY

Embodiments of the present disclosure relate to a method of forming a composite crystalline nitride structure. The method includes depositing a first crystalline nitride layer on a substrate, patterning the first crystalline nitride layer to form a patterned crystalline nitride layer having a top surface and that includes undulations, annealing the patterned crystalline nitride layer at a temperature between 300° C. to 850° C. to form an annealed patterned crystalline nitride layer, and depositing a second crystalline nitride layer on the annealed patterned crystalline nitride layer. The second crystalline nitride layer is lattice-matched to the underlying annealed patterned crystalline nitride layer to within 2%, thereby forming the composite crystalline nitride structure.

Other embodiments of the present disclosure relate to a method of forming a composite crystalline nitride structure. The method includes depositing a first crystalline nitride layer on a substrate in a deposition chamber. The method also includes breaking vacuum thereby exposing the top surface of the first crystalline nitride layer to ambient conditions. The method also includes placing back the exposed first crystalline nitride layer into the deposition chamber. The method also includes annealing the crystalline nitride layer at a temperature between 300° C. to 850° C. to form an annealed crystalline nitride layer. The method also includes depositing a second crystalline nitride layer on the annealed crystalline nitride layer, the second crystalline nitride layer being lattice-matched to the underlying annealed crystalline nitride layer to within 2%, thereby forming a composite crystalline nitride structure.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1A:
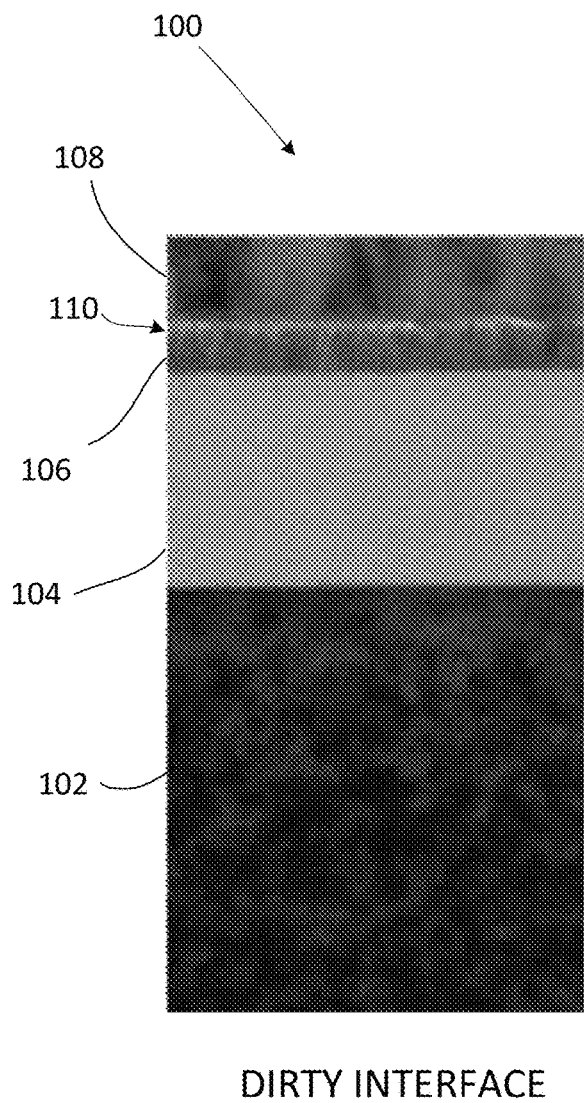
FIGS. 1A and 1B are cross-sectional views of the basic structure of semiconductor device having a plurality of nitride layers where annealing is not performed between subsequent nitride layer formation steps, according to embodiments.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes methods of manufacturing microelectronic devices that include a plurality of different nitride layers. In certain embodiments, after forming a first nitride layer, the device is taken out of the ultra-high vacuum (UHV) processing chamber, and patterning is performed on the first nitride layer. Afterwards, an in situ annealing step is performed on the patterned first nitride layer before a second nitride layer is formed on the first nitride layer. Due to the in situ annealing process performed on the first nitride layer before forming the second nitride layer, the interface between the first and second nitride layers has improved characteristics (i.e., the interface is atomically clean), allowing for epitaxial growth of the second nitride on the patterned first nitride.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1B:
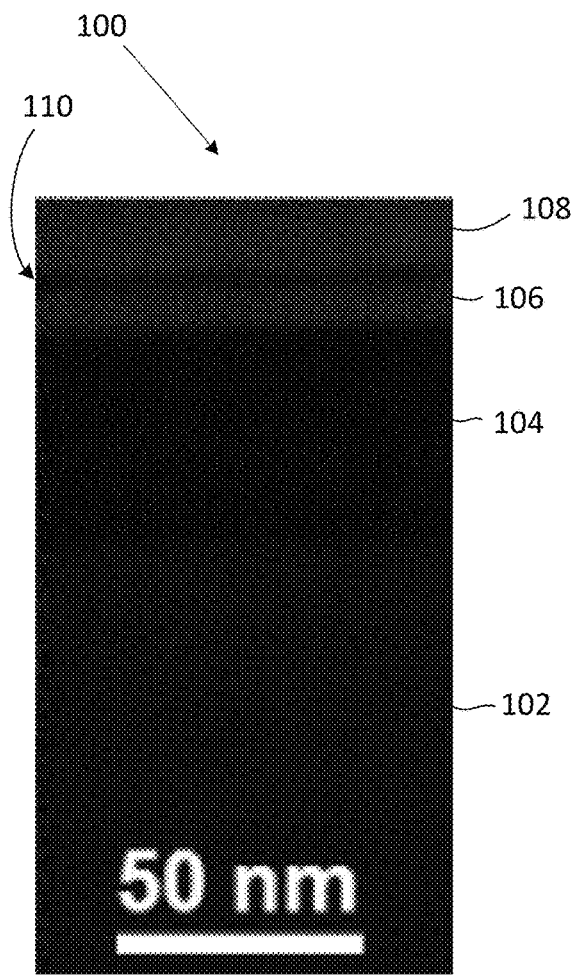

Referring now to the drawings in which like numerals represent the same or similar elements and initially to FIGS. 1A and 1B, a comparative example of a Transmission Electron Microscope (TEM) image of device 100 is shown including a plurality of different nitride layers, where the semiconductor device 100 is not subjected to an annealing processing before the formation of the second nitride layer 108. As shown in FIG. 1A, a substrate 102 is provided. The substrate 102 may comprise a suitable semiconductor material. An underlayer 104 is provided on the substrate. It should be appreciated that any suitable number of underlayers 104 may be provided, and the underlayers may be of the same or different materials. A first nitride layer 106 is formed on the underlayer 104, for example, by a physical vapor deposition (PVD) process in an ultra-high vacuum (UHV) chamber. In certain examples, the first nitride layer 106 is a crystalline nitride layer that may be comprised of TiN or VN. In other examples, the first nitride layer 106 that is deposited on the substrate 102 (or the intervening underlayers 104) includes a metal selected from the group consisting of V, Mo, Cr, Ti, and W. In the example shown in FIG. 1A, after the formation of the first nitride layer 106, the semiconductor device 100 is taken out of the UHV chamber (i.e., the vacuum is broken), and patterning is performed on the first nitride layer 106. However, it should be appreciated that in other examples, patterning does not necessarily need to be performed on the first nitride layer 106. After the patterning is performed on the first nitride layer 106, the device 100 is placed back into a UHV chamber and the second nitride layer 108 is formed. It should be appreciated that the material composition of the second nitride layer 108 may be the same as, or different from, the material composition of the first nitride layer 106. In one example, the first nitride layer 106 is an 8 nm thick TiN layer, and the second nitride layer 108 is a 20 nm thick TiN layer. However, other materials and layer thicknesses may be used. As shown in FIG. 1A, an interface 110 between the first nitride layer 106 and the second nitride layer 108 appears as a brighter white line. In other words, the interface is dirty, or has discontinuities in the crystal growth structure between the layers. This may be due to a disordered dirty interface between the crystal growth structure of the first nitride layer 106 and the second nitride layer 108. Referring now to FIG. 1B, this figure is a reverse contrast TEM image of the same device 100 of FIG. 1A, where the Z-contrast image highlights the disordered dirty interface 110 between the different nitride layers 106 and 108 (i.e., the interface 110 appears darker than the first nitride layer 106 and the second nitride layer 108).

Figure 2A:
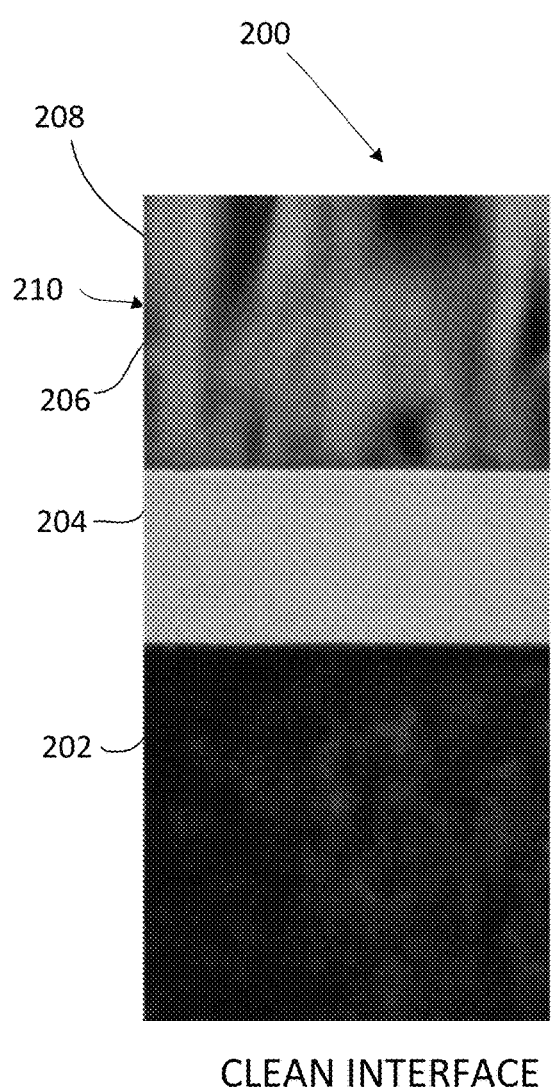
FIGS. 2A and 2B are a cross-sectional view of the basic structure of semiconductor device having a plurality of nitride layers where in situ annealing in UHV is performed before subsequent nitride layer formation steps, according to embodiments.
Figure 2B:
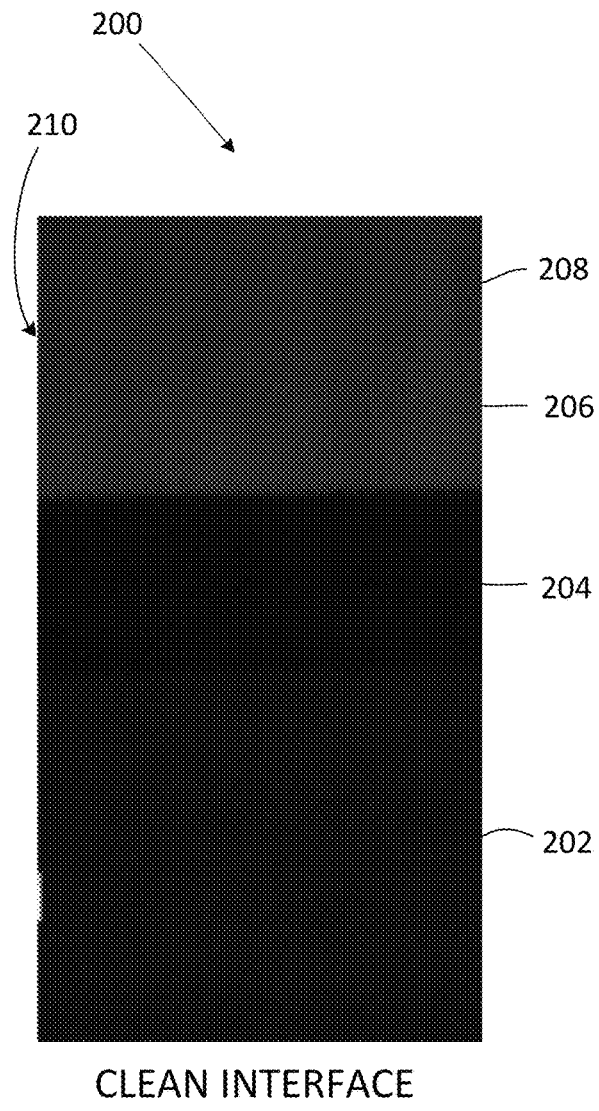

Referring now to FIGS. 2A and 2B, an embodiment of a semiconductor device 200 is shown including a plurality of different nitride layers, where the semiconductor device 200 is subjected to an in situ annealing processing before the formation of the second nitride layer 208. As shown in FIG. 2A, a substrate 202 is provided. The substrate 202 may comprise a suitable semiconductor material. An underlayer 204 is provided on the substrate. It should be appreciated that any suitable number of underlayers 204 may be provided, and the underlayers may be of the same or different materials. A first nitride layer 206 is formed on the underlayer 204, for example, by a physical vapor deposition (PVD) process in an ultra-high vacuum (UHV) chamber. In certain examples, the first nitride layer 206 is a crystalline nitride layer that may be comprised of TiN, or VN. In other examples, the first nitride layer 206 that is deposited on the substrate 202 (or the intervening underlayers 204) includes a metal selected from the group consisting of V, Mo, Cr, Ti, and W. In other examples, the nitrides of the first nitride layer 206 and the second nitride layer 208 are a group IV, V or VI nitride. In other examples, the nitride material of at least one of the first nitride layer 106 and the second nitride layer 208 is a superconducting material. In the example shown in FIG. 2A, before the formation of the second nitride layer 208, the semiconductor device 200 is subjected to annealing. For example, the annealing may be performed in situ for 30 minutes at a temperature of 700° C. In general, the annealing may be performed for any suitable amount of time, and at any suitable temperature that is suitable for the particular materials comprising the respective nitride layer. In other examples, the annealing of the patterned crystalline nitride layer is performed at a temperature between 300° C. to 850° C. In certain embodiments, a thickness of the first crystalline nitride layer ranges from 1 nm to 1 μm, and a thickness of the second crystalline nitride layer ranges from 1 nm to 1 μm.

Referring again to FIG. 2A, after the annealing operation, the device 200 is taken out of the UHV chamber (i.e., the vacuum is broken), and patterning is performed on the first nitride layer 206. However, it should be appreciated that in other examples, patterning does not necessarily need to be performed on the first nitride layer 206. After the patterning is performed on the first nitride layer 206, the device 200 is placed back into a UHV chamber. Thereafter, an in situ anneal of the patterned first nitride layer is performed followed by formation of the second nitride layer 208. It should be appreciated that the material composition of the second nitride layer 208 may be the same as, or different from, the material composition of the first nitride layer 206. In one example, the first nitride layer 206 is a 30 nm thick VN layer, and the second nitride layer 208 is a 30 nm thick VN layer. However, other materials and layer thicknesses may be used. As shown in FIG. 2A, an interface 210 between the first nitride layer 206 and the second nitride layer 208 is no longer apparent (i.e., in comparison to the example discussed above with respect to FIGS. 1A and 1B). In other words, the interface is clean, or has a reduced level of discontinuities (or no discontinuities) in the crystal growth structure between the layers. In certain embodiments, owing to the annealing of the patterned first nitride layer 206 leading to cleaning of the top surface of the patterned first nitride layer before growth of the second nitride layer, the lattice mismatch between the crystal growth structure of the first nitride layer 206 and the second nitride layer 208 may be significantly reduced. In one example, the second nitride layer 208 is lattice-matched to the underlying patterned first nitride layer 206 to within 2%, thereby forming a composite crystalline nitride structure. In general, lattice mismatch is a relative difference between the in-plane lattice constants of the different layers, giving either a positive or a negative strain value specified as a percentage value. Referring now to FIG. 2B, this figure is a reverse contrast TEM image of the same device 200 of FIG. 2A, where the Z-contrast image highlights the lack of an apparent interface 210 between the different nitride layers 206 and 208.

Figure 3A:
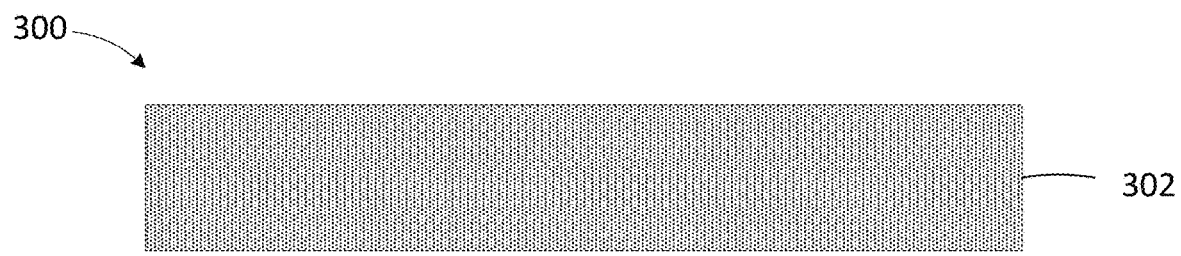
FIG. 3A is a cross-sectional view of a semiconductor device at an intermediate stage of the manufacturing process, according to embodiments.
Figure 3B:
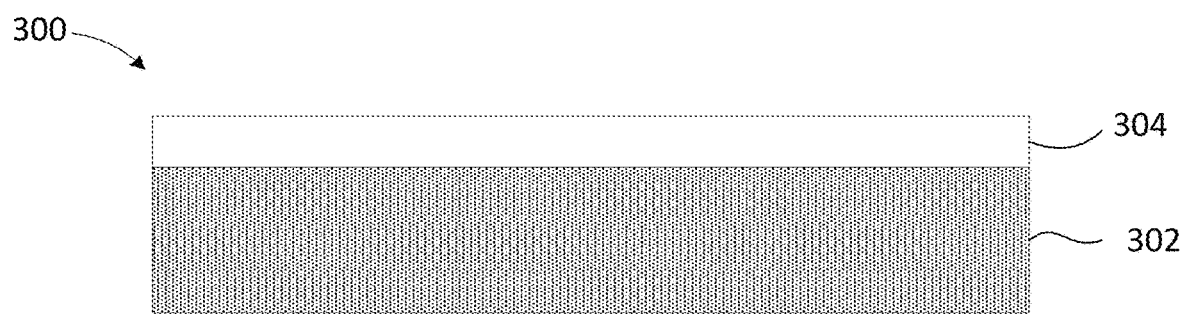
FIG. 3B is a cross-sectional view of the semiconductor device of 3A at a subsequent stage of the manufacturing process, according to embodiments.
Figure 3C:
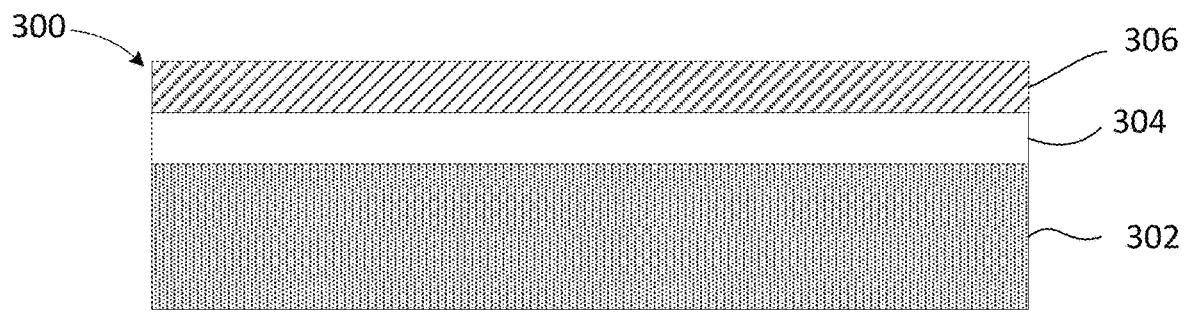
FIG. 3C is a cross-sectional view of the semiconductor device of 3B at a subsequent stage of the manufacturing process, according to embodiments.
Figure 3D:
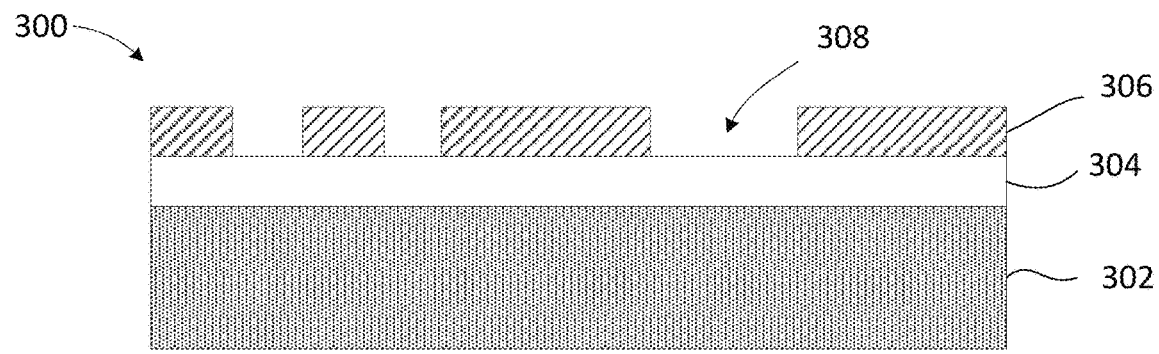
FIG. 3D is a cross-sectional view of the semiconductor device of 3C at a subsequent stage of the manufacturing process, according to embodiments.
Figure 3E:
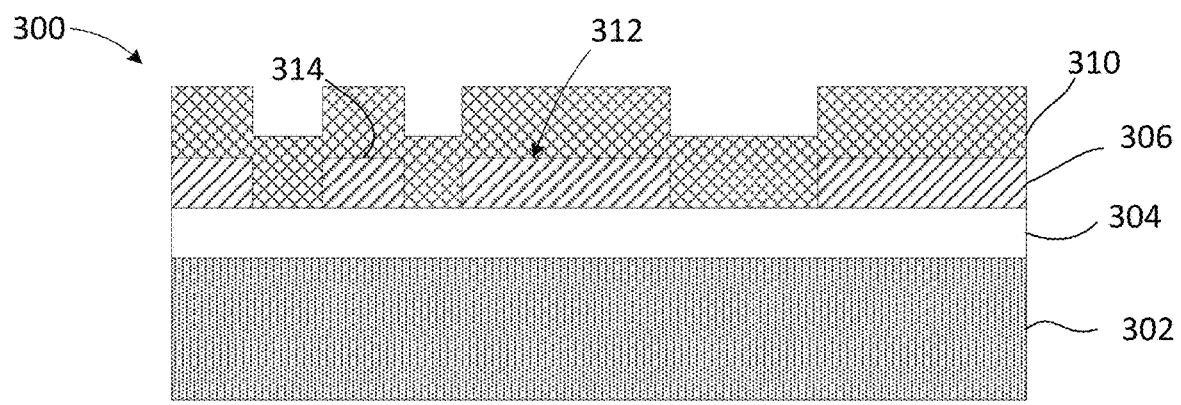
FIG. 3E is a cross-sectional view of the semiconductor device of 3D at a subsequent stage of the manufacturing process, according to embodiments.

Referring now to FIGS. 3A-3E, and initially to FIG. 3A, a method of manufacturing a device 300 is shown. As shown in FIG. 3A, a substrate 302 is provided. As shown in FIG. 3B, an underlayer 304 is provided on the substrate 302. It should be appreciated that one or more than one underlayer 304 may be provided. As shown in FIG. 3C, a first nitride layer 306 is formed on the underlayer 304. The first nitride layer 306 may be formed by a PVD process in a UHV chamber. After the first nitride layer 306 is formed, device 300 is taken out of the UHV chamber (i.e., the vacuum is broken) for continued processing. As shown in FIG. 3D, the first nitride layer 306 is patterned to form a series of undulations 308 (i.e., higher and lower points in the first nitride layer 306). In certain embodiments, a feature size of the undulations varies from 5 nm to 5 um. The patterning may be performed using dry or wet etching techniques, or any other suitable material removal techniques known to one of skill in the art. As shown in FIG. 3E, the patterned first nitride layer 306 is placed back into the UHV chamber, and an in situ annealing is performed followed by formation of a second nitride layer 310 on the first nitride layer 306. In the example shown in FIG. 3E, the second nitride layer 310 is formed over the entire surface of the semiconductor device 300 to fill in the undulations 308 and to have a certain layer thickness of the second nitride layer 310 above an upper surface of the first nitride layer 306. Thus, an interface 314 is inherently formed between the first nitride layer 306 and the second nitride layer 310. However, as discussed above with respect to FIGS. 2A and 2B, the interface is almost unnoticeable due to the prior annealing step of the first nitride layer 306 before formation of the second nitride layer 310. It should be appreciated that although the process step discussed with regard to the embodiments of FIG. 3A-3E includes a step of patterning the first nitride layer 306, this step is not necessary to achieve a clean interface between the first nitride layer 306 and the second nitride layer 310. In other words, a second nitride layer 310 could be formed on the first nitride layer 306 (i.e., after annealing is performed to the first nitride layer 306) without any patterning, and the same clean interface between the layers would be achieved. In certain examples, the second nitride layer 310 is lattice-matched to the underlying patterned first nitride layer 306 to within 2%, thereby forming a composite crystalline nitride structure.

Figure 4:
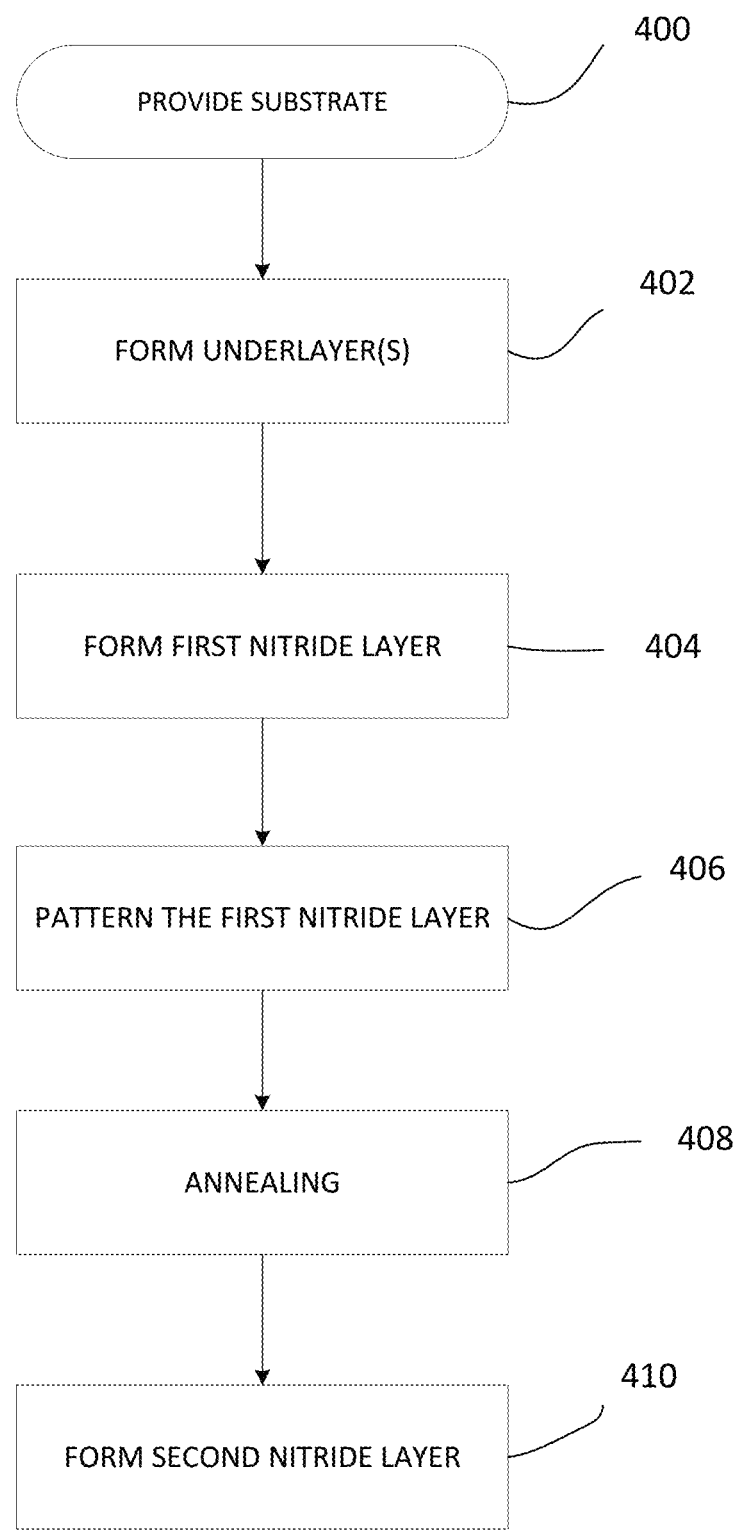
FIG. 4 is a flow diagram of a method of manufacturing a semiconductor device having a plurality of different nitride layers, according to embodiments.

Referring now to FIG. 4, a flow-chart is shown illustrating the method of manufacturing a semiconductor device discussed above with respect to FIGS. 3A-3E. As shown in FIG. 4, a substrate is provided at operation 400. At operation 402, an underlayer is provided on the substrate. After the first nitride layer is formed at operation 404, the device is taken out of the UHV chamber (i.e., the vacuum is broken) for continued processing. As shown in FIG. 4, the first nitride layer is patterned at operation 406 to form a series of undulations (i.e., higher and lower points in the first nitride layer). The patterning may be performed using dry or wet etching techniques, or any other suitable material removal techniques known to one of skill in the art. As shown in FIG. 4, the patterned first nitride layer is placed back in the UHV chamber and annealing is performed at operation 408, which cleans the surface of the patterned first nitride layer. Finally, at operation 410, a second nitride layer is formed on the first nitride layer. In certain embodiments, the second nitride layer is formed over the entire surface of the semiconductor device to fill in the undulations and to have a certain layer thickness of the second nitride layer above an upper surface of the first nitride layer. Thus, an interface is inherently formed between the first nitride layer and the second nitride layer. However, as discussed above with respect to FIGS. 2A and 2B, the interface is almost unnoticeable due the prior annealing step of the first nitride layer before the formation of the second nitride layer. In certain examples, the second nitride layer 310 is lattice-matched to the underlying patterned first nitride layer to within 2%, thereby forming a composite crystalline nitride structure.

In the present embodiments, it is possible to clean the TiN, VN, etc. surface of the first nitride layer in a range of about 300° C. to 850° C. (i.e., rather than higher temperatures such as 1000° C. or higher). Moreover, it is possible to grow an additional second nitride layer (e.g., TiN) after annealing with no detectable contamination and with epitaxy (i.e., it is possible to clean the surface of the first nitride layer on the atomic scale). Also, in the present embodiments, not only is the nitride surface cleaned simply by annealing, but the surface also retains its crystal structure to then allow for further growth of nitride layers. As described above, there is no (or nearly no) noticeable interface between the first and second nitride layers.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    depositing a first crystalline nitride layer on a planar substrate;
    patterning the first crystalline nitride layer to expose portions of the substrate and form a patterned crystalline nitride layer including undulations;
    annealing the patterned crystalline nitride layer at a temperature between 300° C. to 850° C. to form an annealed patterned crystalline nitride layer; and
    depositing a second crystalline nitride layer directly on the annealed patterned crystalline nitride layer and the substrate, thereby forming a composite crystalline nitride structure.

2. The method of claim 1, wherein the first crystalline nitride layer deposited on the substrate includes a metal selected from the group consisting of V, Mo, Cr, Ti, and W.

3. The method of claim 1, wherein:
    the first crystalline nitride layer deposited on the substrate includes Ti, and the second crystalline nitride layer includes V; or
    the first crystalline nitride layer deposited on the substrate includes Ti, and the second crystalline nitride layer includes Ti; or
    the first crystalline nitride layer deposited on the substrate includes V, and the second crystalline nitride layer includes Ti; or
    the first crystalline nitride layer deposited on the substrate includes V, and the second crystalline nitride layer includes V.

4. The method of claim 1, wherein the undulations are created by dry etching or wet etching.

5. The method of claim 1, wherein a thickness of the first crystalline nitride layer ranges from 1 nm to 1 µm.

6. The method of claim 1, wherein a thickness of the second crystalline nitride layer ranges from 1 nm to 1 µm.

7. The method of claim 1, wherein the nitrides of the first and second crystalline nitride layers are a group IV, V or VI nitride.

8. The method of claim 1, wherein the nitride of at least one of the first and second crystalline nitride layers is a superconducting material.

9. The method of claim 1, wherein the first and second crystalline nitride layers are formed by a physical vapor deposition process.

10. A method, comprising:
    depositing a first crystalline nitride layer on a planar substrate in a deposition chamber;
    breaking vacuum thereby exposing a top surface of the first crystalline nitride layer to ambient conditions;
    patterning the first crystalline nitride layer to expose portions of the substrate and form a patterned crystalline nitride layer including undulations;
    placing the patterned crystalline nitride layer into the deposition chamber;
    annealing the crystalline nitride layer at a temperature between 300° C. to 850° C. to form an annealed crystalline nitride layer; and
    depositing a second crystalline nitride layer directly on the annealed crystalline nitride layer and the substrate, thereby forming a composite crystalline nitride structure.

11. The method of claim 10, wherein the first crystalline nitride layer deposited on the substrate includes a metal selected from the group consisting of V, Mo, Cr, Ti, and W.

12. The method of claim 10, wherein:
    the first crystalline nitride layer deposited on the substrate includes Ti, and the second crystalline nitride layer includes V; or the first crystalline nitride layer deposited on the substrate includes Ti, and the second crystalline nitride layer includes Ti; or the first crystalline nitride layer deposited on the substrate includes V, and the second crystalline nitride layer includes Ti; or the first crystalline nitride layer deposited on the substrate includes V, and the second crystalline nitride layer includes V.

13. The method of claim 10, wherein a feature size of the undulations varies from 5 nm to 5 µm.

14. The method of claim 13, wherein the undulations are created by dry etching or wet etching.

15. The method of claim 10, wherein a thickness of the first crystalline nitride layer ranges from 1 nm to 1 µm, and wherein a thickness of the second crystalline nitride layer ranges from 1 nm to 1 µm.

16. The method of claim 10, wherein each of the first crystalline nitride layer and the second crystalline nitride layer include a group IV, V or VI nitride.

17. The method of claim 10, wherein at least one of the first crystalline nitride layer and the second crystalline nitride layer includes a superconducting material.

18. The method of claim 10, wherein the first and second crystalline nitride layers are formed by a physical vapor deposition process.

19. The method of claim 1, wherein the second crystalline nitride layer is lattice-matched to the annealed patterned crystalline nitride layer.

20. The method of claim 10, wherein the second crystalline nitride layer is lattice-matched to the annealed patterned crystalline nitride layer.

\* \* \* \* \*